(12) United States Patent
Fang et al.

(10) Patent No.: US 10,714,513 B2
(45) Date of Patent: Jul. 14, 2020

(54) ARRAY SUBSTRATE AND MANUFACTURING METHOD THEREOF, LIQUID CRYSTAL DISPLAY DEVICE AND MANUFACTURING METHOD THEREOF

(71) Applicants: BOE TECHNOLOGY GROUP CO., LTD., Beijing (CN); HEFEI BOE DISPLAY TECHNOLOGY CO., LTD., Anhui (CN)

(72) Inventors: Maomao Fang, Beijing (CN); Youngjin Song, Beijing (KR); Ziheng Yang, Beijing (CN); Shifei Shen, Beijing (CN); Dengtao Li, Beijing (CN); Shengrong Li, Beijing (CN); Yishen Wang, Beijing (CN)

(73) Assignees: BOE TECHNOLOGY GROUP CO., LTD., Beijing (CN); HEFEI BOE DISPLAY TECHNOLOGY CO., LTD., Anhui (CN)

( * ) Notice: Subject to any disclaimer, the term of this patent is extended or adjusted under 35 U.S.C. 154(b) by 168 days.

(21) Appl. No.: 15/951,340

(22) Filed: Apr. 12, 2018

(65) Prior Publication Data
US 2019/0064583 A1   Feb. 28, 2019

(30) Foreign Application Priority Data
Aug. 31, 2017   (CN) .......................... 2017 1 0772131

(51) Int. Cl.
*G02F 1/1333* (2006.01)
*H01L 27/12* (2006.01)
(Continued)

(52) U.S. Cl.
CPC ........ *H01L 27/1288* (2013.01); *G02F 1/1368* (2013.01); *G02F 1/133345* (2013.01);
(Continued)

(58) Field of Classification Search
CPC ... G02F 1/136227; G02F 2001/136231; G02F 2001/136236; G02F 2001/13625;
(Continued)

(56) References Cited

U.S. PATENT DOCUMENTS

| | | | | |
|---|---|---|---|---|
| 8,933,454 B2* | 1/2015 | Kim | ................. | G02F 1/136227 257/59 |
| 9,470,923 B2* | 10/2016 | Woo | ...................... | G06F 3/0412 |
| 10,141,348 B2* | 11/2018 | Kim | .................... | G02F 1/13624 |

* cited by examiner

*Primary Examiner* — Paisley L Wilson
(74) *Attorney, Agent, or Firm* — Calfee, Halter & Griswold LLP (57) ABSTRACT

An array substrate and a manufacturing method thereof are disclosed. The manufacturing method includes forming, on a substrate, a first metal pattern layer, a first insulating layer, a second metal pattern layer, and a second insulating layer, successively; coating a photoresist on the second insulating layer; forming a photoresist pattern and an etching protection layer, in a first region of the array substrate, the photoresist pattern exposing a part of the top surface of the second insulating layer, and being coupled to the second insulating layer through the etching protection layer; and performing etching in the first region by using the photoresist pattern as a mask to remove the etching protection layer and at least part of the second insulating layer, without etching the first insulating layer, so as to expose a part of the second metal pattern layer and form a liquid crystal diversion groove.

20 Claims, 5 Drawing Sheets

(51) Int. Cl.
*G02F 1/1362* (2006.01)
*G02F 1/1368* (2006.01)
*G02F 1/1337* (2006.01)

(52) U.S. Cl.
CPC .. *G02F 1/136227* (2013.01); *G02F 1/136286* (2013.01); *H01L 27/1214* (2013.01); *G02F 1/133711* (2013.01); *G02F 2001/13625* (2013.01); *G02F 2001/133792* (2013.01); *G02F 2001/136231* (2013.01); *G02F 2001/136236* (2013.01); *G02F 2201/121* (2013.01); *G02F 2201/123* (2013.01)

(58) Field of Classification Search
CPC ............. G02F 1/133345; G02F 1/1341; G02F 1/136286; H01L 27/1259; H01L 27/1288
See application file for complete search history.

ARRAY SUBSTRATE AND MANUFACTURING METHOD THEREOF, LIQUID CRYSTAL DISPLAY DEVICE AND MANUFACTURING METHOD THEREOF

RELATED APPLICATION

The present application claims the benefit of Chinese Patent Application No. 201710772131.5, filed on Aug. 31, 2017, the entire disclosure of which is incorporated herein by reference.

TECHNICAL FIELD

The present disclosure generally relates to the field of display technologies. More specifically, the present disclosure relates to a method of manufacturing an array substrate, an array substrate manufactured thereby, a method of manufacturing a liquid crystal display device, and a liquid crystal display device manufactured thereby.

BACKGROUND

With the development of the thin film field effect transistor liquid crystal display (TFT-LCD) technology and the progress in the industrial technologies, the production cost of liquid crystal displays is continuously reduced and the manufacturing process thereof is increasingly improved, thus they have become a mainstream technology in the flat panel display field in place of cathode ray tube displays. TFT-LCD displays have become ideal display devices due to their advantages such as small size, low power consumption, no radiation, and so on. The basic structure of a TFT-LCD comprises an array substrate, a color filter substrate, and a liquid crystal layer (LC) sandwiched between the two substrates. A polyimide film layer (alignment film layer) having an orientation effect on the liquid crystals is arranged on the surfaces of the array substrate and the color filter substrate. Taking the existing twisted nematic (TN) type TFT-LCD as an example, the TFT structure is formed by depositing a gate electrode, a common electrode, a first insulating layer, an active layer, a source/drain electrode, a second insulating layer, and a pixel electrode on a glass substrate successively, the gate electrode and the common electrode are arranged in the same layer.

SUMMARY

Embodiments of the disclosure aim to provide an improved method of manufacturing an array substrate, an array substrate made thereby, a method of manufacturing a liquid crystal display device, and a liquid crystal display device made thereby.

Typically, the color filter substrate and the array substrate are spaced apart from each other by a spacer after assembly, and liquid crystals are injected into a gap between the color filter substrate and the array substrate to form a liquid crystal layer. However, due to the height difference between different portions of the array substrate, it may be difficult for the liquid crystals to flow to and cover the entire surface of the array substrate, such that the formed liquid crystal layer may break on certain regions of the array substrate, thereby affecting the display effect and the yield of the liquid crystal display device.

Accordingly, it is proposed to form a liquid crystal diversion groove on the array substrate, which is used for diverting the liquid crystal, thereby forming a uniformly distributed liquid crystal layer on the array substrate. However, inventor(s) of the disclosure realize that, for the design of the existing liquid crystal diversion groove, the insulating layer below the metal layer may also be etched away during the process of etching the insulating layer above the metal layer to form the liquid crystal diversion groove, thereby forming an over-etching chamfer below the metal layer. When a subsequent layer is being made, the subsequent layer may break due to the presence of the over-etching chamfer, thereby affecting the display effect and the yield of the liquid crystal display device.

Therefore, according to an aspect of the disclosure, there is provided a method of manufacturing an array substrate, comprising: forming, on a substrate, a first metal pattern layer, a first insulating layer, a second metal pattern layer, and a second insulating layer, successively; coating a photoresist on the second insulating layer; forming a photoresist pattern and an etching protection layer, in a first region of the array substrate, the photoresist pattern exposing a part of a top surface of the second insulating layer, and the photoresist pattern being coupled to the second insulating layer through the etching protection layer, and in the first region, orthographic projections of the second insulating layer and the second metal pattern layer on the substrate overlapping; and performing etching in the first region by using the photoresist pattern as a mask to remove the etching protection layer and at least part of the second insulating layer, without etching the first insulating layer, so as to expose a part of the second metal pattern layer and form a liquid crystal diversion groove.

According to some embodiments, the photoresist pattern further exposes the second insulating layer in a second region of the array substrate. In the second region, orthographic projections of the second insulating layer and the first metal pattern layer on the substrate overlap. The method further comprises in the second region, etching the first insulating layer and the second insulating layer using the photoresist pattern as a mask, thereby exposing the first metal pattern layer.

In such embodiments, openings on the first metal pattern layer and the second metal pattern layer may be formed simultaneously by one patterning process, so as to connect the first metal pattern layer and the second metal pattern layer to an external electric signal terminal, thereby simplifying the manufacturing process and saving the manufacturing cost.

According to some embodiments, the etching protection layer has a same material as the photoresist pattern.

According to some embodiments, in case the etching protection layer has the same material as the photoresist pattern, the step of forming the etching protection layer comprises in the first region, filling a gap between the photoresist pattern and the second insulating layer with the photoresist.

According to further embodiments, in case the etching protection layer has the same material as the photoresist pattern, the step of forming the photoresist pattern by exposing and developing the photoresist, and forming the etching protection layer comprises: exposing the photoresist using a half-tone photolithography mask plate, so that the photoresist is partially exposed in the first region; developing the photoresist after exposure so that the etching protection layer and the photoresist pattern are simultaneously formed in the first region.

According to some embodiments, exposing the photoresist using a half-tone photolithography mask plate further causes the photoresist to be fully exposed in the second region.

In such embodiments, openings on the first metal pattern layer and the second metal pattern layer may be formed simultaneously by one patterning process, so as to connect the first metal pattern layer and the second metal pattern layer to an external electric signal terminal, thereby simplifying the manufacturing process and saving the manufacturing cost.

According to some embodiments, the method of manufacturing an array substrate further comprises forming an active layer pattern on the first insulating layer prior to forming the second metal pattern layer.

According to some embodiments, the first metal pattern layer is a gate metal pattern layer, the first insulating layer is a gate insulating layer, the second metal pattern layer is a source/drain metal pattern layer, and the second insulating layer is a passivation layer. In such embodiments, the formed array substrate is of bottom gate structure.

According to some embodiments, the first metal pattern layer is a source/drain metal pattern layer, the first insulating layer is a gate insulating layer, the second metal pattern layer is a gate metal pattern layer, and the second insulating layer is a passivation layer. In such embodiments, the formed array substrate is of top gate structure.

According to some embodiments, the gate metal pattern layer includes a common electrode line pattern.

According to some embodiments, the method of manufacturing an array substrate further comprises removing the photoresist pattern after the liquid crystal diversion groove is formed, and forming a pixel electrode pattern layer.

According to some embodiments, the first region and the second region are located in a pixel area of the array substrate.

According to another aspect of the present disclosure, there is provided an array substrate manufactured by means of any of the methods described above.

According to a further aspect of the present disclosure, there is provided a method of manufacturing a liquid crystal display device, comprising: forming an array substrate by means of any of the methods described above; forming a liquid crystal layer on the array substrate; and forming a color filter substrate on the liquid crystal layer for assembly with the array substrate.

According to some embodiments, providing a liquid crystal layer on the array substrate comprises diverting a liquid crystal through the liquid crystal diversion groove so that the liquid crystal is continuously distributed in the pixel area of the array substrate.

According to yet another aspect of the disclosure, there is provided a liquid crystal display device manufactured by means of the method of manufacturing a liquid crystal display device described above.

It is to be understood that various aspects according to the disclosure have the same or similar features and embodiments. The above general description and the following detailed description are merely exemplary and explanatory and are not intended to limit the disclosure in any way.

BRIEF DESCRIPTION OF DRAWINGS

In order to explain the technical solutions in embodiments of the present disclosure more clearly, the drawings that need to be used in the description of the embodiments will be briefly described below. It is obvious that the drawings in the description below are merely some embodiments of the present disclosure.

FIG. 2b schematically shows a sectional view of an over-etching chamfer formed with the photoresist pattern shown in FIG. 2a.

Through the above-described drawings, specific embodiments of the disclosure have been shown, which will be described in more detail later. These drawings and textual descriptions are not intended to limit the scope of the disclosure in any way, but the inventive concept will be described for those ordinarily skilled in the art by referring to specific embodiments.

DETAILED DESCRIPTION OF EMBODIMENTS

To make the objectives, technical solutions, and advantages of the embodiments of the disclosure clearer, some embodiments of the present disclosure will be further described in detail below with reference to the accompanying drawings.

Figure 1:
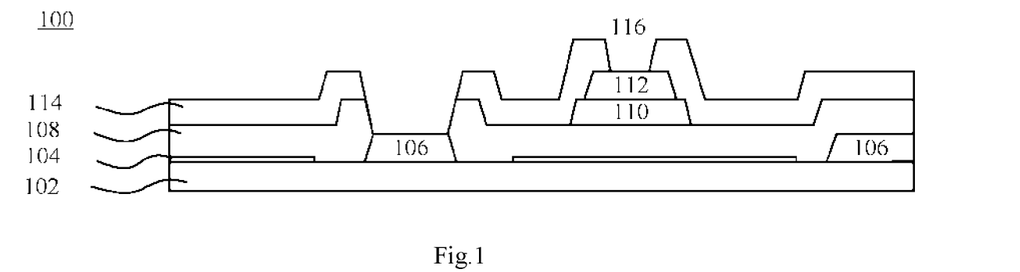
FIG. 1 schematically shows a sectional view of a typical array substrate.

FIG. 1 schematically shows a sectional view of a typical array substrate. As shown in FIG. 1, an array substrate 100 comprises a common electrode line pattern 104, a gate line pattern 106, a gate insulating layer 108, an active layer 110, a source/drain metal pattern layer 112, and a passivation layer 114, which are arranged successively on a substrate 102. In order to apply an external electrical signal to the source/drain metal pattern layer 112, an opening 116 exposing the source/drain metal pattern layer 112 is formed in the passivation layer 114. However, when liquid crystals are injected onto the array substrate 100, the liquid crystals may gather in the opening 116 and cannot flow to the right side of the opening 116, thus causing the formed liquid crystal layer to break at the edge of the opening 116, thereby affecting the display effect and the yield of the liquid crystal display device.

Figure 2A:
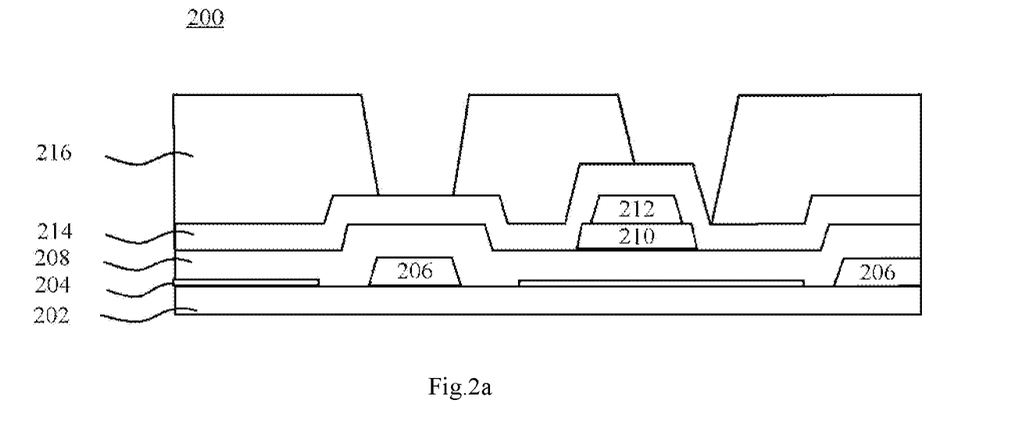
FIG. 2a schematically shows a sectional view of a typical photoresist pattern for forming a liquid crystal diversion groove.

Accordingly, it is proposed to form a liquid crystal diversion groove on the array substrate, which is used for diverting the liquid crystals, so that a uniformly distributed liquid crystal layer is formed on the array substrate. FIG. 2a schematically shows a sectional view of a typical photoresist pattern for forming a liquid crystal diversion groove. As shown in FIG. 2a, in an array substrate 200, a common electrode line pattern 204, a gate line pattern 206, a gate insulating layer 208, an active layer 210, a source/drain metal pattern layer 212 and a passivation layer 214 are formed on a substrate 202, successively. Then, a photoresist pattern 216 is formed on the passivation layer 214. The photoresist pattern 216 exposes a part of the passivation layer 214 above the source/drain metal pattern layer 212 and an insulating layer above the gate line pattern 206. The exposed portion of the passivation layer 214 is then etched away using the photoresist pattern 216 as a mask in order to, on the one hand, apply an external electrical signal to the gate line pattern 206 and the source/drain metal pattern layer 212, and on the other hand, form a liquid crystal diversion groove of the passivation layer 214 above the source/drain metal pattern 212. Compared to the array substrate 100 shown in FIG. 1, in the array substrate 200, since the opening 116 in the passivation layer 114 as shown in FIG. 1 is absent, the liquid crystals can be prevented from gathering in the opening 116 and being unable to flow to the left and right sides of the opening 116, which causes the formed liquid crystal layer to break at the edge of the opening 116, affecting the display effect and the yield of the liquid crystal display device.

Figure 2B:
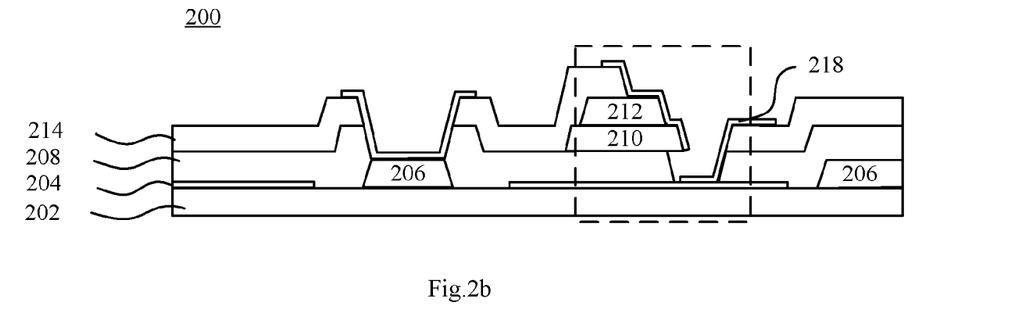

However, in fact, during the process of etching the passivation layer 214, after the passivation layer 214 is etched away, the gate insulating layer 208 continues to be etched until the common electrode line pattern 204 is exposed, thereby forming an over-etching chamfer below the active layer 210 and the source/drain metal pattern layer 212, as shown by a dashed box in FIG. 2b. Therefore, at the time of forming a pixel electrode pattern layer 218 subsequently, the pixel electrode pattern layer 218 will break at the over-etching chamfer, thereby affecting the normal operation and the yield of the liquid crystal display device.

Figure 3:
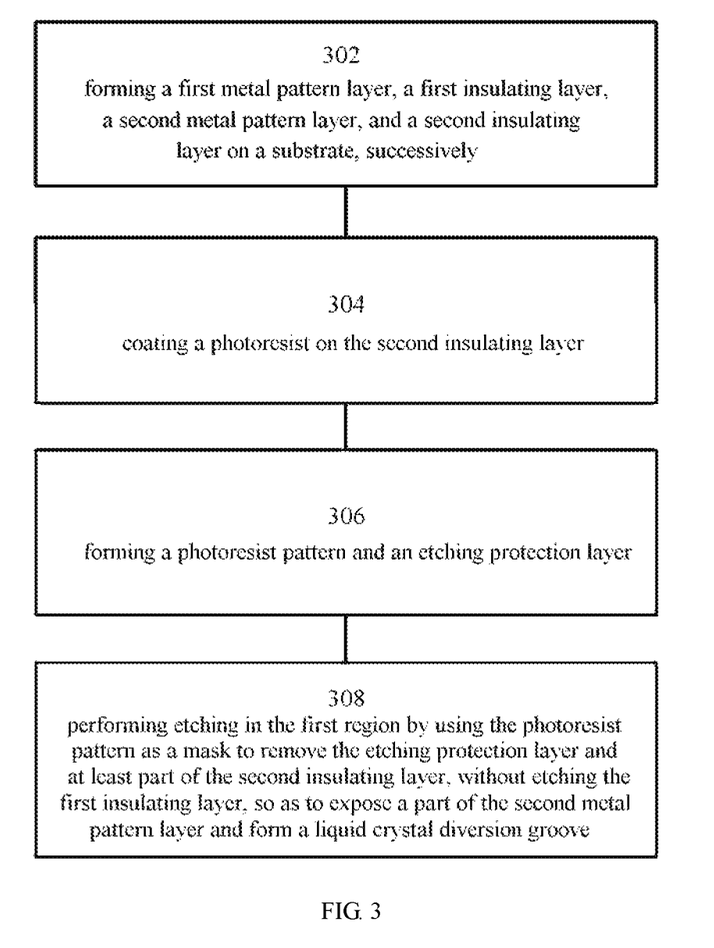
FIG. 3 illustrates a flowchart of a method of manufacturing an array substrate according to an embodiment of the present disclosure.

Accordingly, an embodiment of the disclosure proposes an improved method of manufacturing an array substrate. FIG. 3 illustrates a flowchart of a method 300 of manufacturing an array substrate according to an embodiment of the disclosure. In step 302, a first metal pattern layer, a first insulating layer, a second metal pattern layer, and a second insulating layer are formed on a substrate, successively. Then, in step 304, a photoresist is coated on the second insulating layer. Next, in step 306, a photoresist pattern is formed by exposing and developing the photoresist, and an etching protection layer is formed. In a first region of the array substrate, the photoresist pattern exposes a part of the top surface of the second insulating layer and is connected to the second insulating layer through the etching protection layer. In the first region, the orthographic projections of the second insulating layer and the second metal pattern layer on the substrate overlap. Finally, in step 308, in the first region, the etching protection layer is etched away using the photoresist pattern as a mask and at least part of the second insulating layer is etched without etching the first insulating layer, thereby exposing a part of the second metal pattern layer and forming a liquid crystal diversion groove.

As used herein, the term "liquid crystal diversion groove" refers to a structure that promotes uniform distribution of liquid crystals on an array substrate. In the manufacturing method of an array substrate described above, the first insulating layer is protected by forming an etching protection layer, so that when etching is being performed using the photoresist pattern as a mask, only the etching protection layer and at least part of the second insulating layer are etched away while the first insulating layer is not etched. Thus, the formation of an over-etching chamfer below the second metal pattern layer can be avoided, which can improve the display effect and the yield of the liquid crystal display device.

FIGS. 4a-4f schematically show sectional views corresponding to steps of the method of manufacturing an array substrate according to an embodiment of the disclosure. In FIGS. 4a-4f, the method of manufacturing an array substrate according to an embodiment of the present disclosure is described based on an example in which the first metal pattern layer is a gate metal pattern layer, the first insulating layer is a gate insulating layer, the second metal pattern layer is a source/drain metal pattern layer, and the second insulating layer is a passivation layer. However, the inventive concept of the disclosure can also be applied to an array substrate of top gate structure, in which the first metal pattern layer is a source/drain metal pattern layer, the first insulating layer is a gate insulating layer, the second metal pattern layer is a gate metal pattern layer, and the second insulating layer is a passivation layer.

Figure 4A:
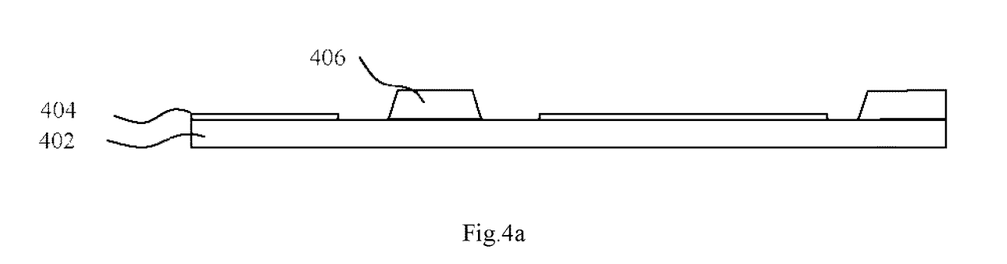
FIGS. 4a-4f schematically shows sectional views corresponding to steps of the method of manufacturing an array substrate according to an embodiment of the present disclosure.

Firstly, as shown in FIG. 4a, a common electrode line pattern 404 and a gate line pattern 406 are formed on a substrate 402. The common electrode line pattern 404 and the gate line pattern 406 may be formed in the same layer with the same material. In this case, the common electrode line pattern 404 and the gate line pattern 406 may be collectively referred to as a gate metal pattern layer.

Figure 4B:
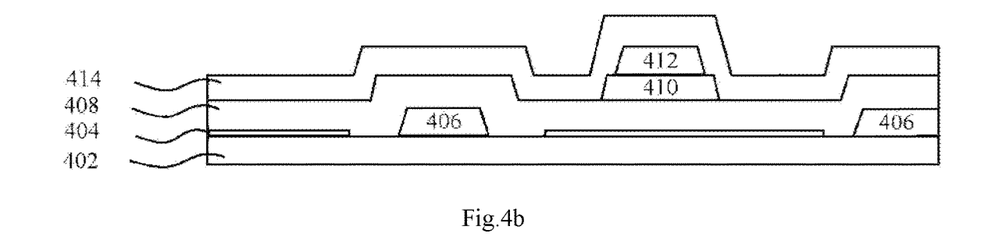

Next, as shown in FIG. 4b, a gate insulating layer 408, an active layer 410, a source/drain metal pattern layer 412, and a passivation layer 414 are formed on the common electrode line pattern 404 and the gate line pattern 406, successively.

Figure 4C:
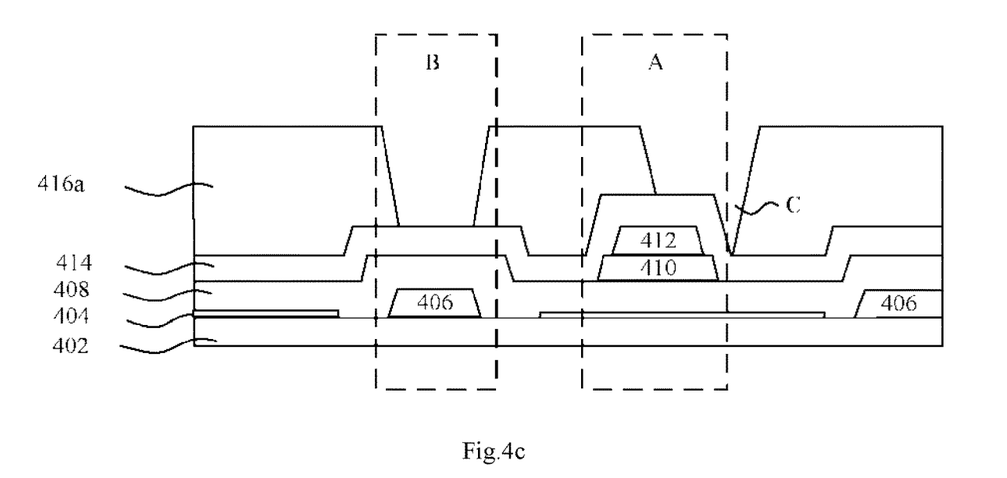

Subsequently, as shown in FIG. 4C, a photoresist is coated on the passivation layer 414. The photoresist is exposed and developed to form a photoresist pattern 416a. In a first region A of the array substrate, the photoresist pattern 416a exposes a part of the top surface of the passivation layer 414. In the first region A, the orthographic projections of the passivation layer 414 and the source/drain metal pattern layer 412 on the substrate 402 overlap. The photoresist pattern 416a further exposes the passivation layer 414 in a second region B of the array substrate. In the second region B, the orthographic projections of the passivation layer 414 and the gate metal pattern layer 406 on the substrate 402 overlap.

Figure 4D:
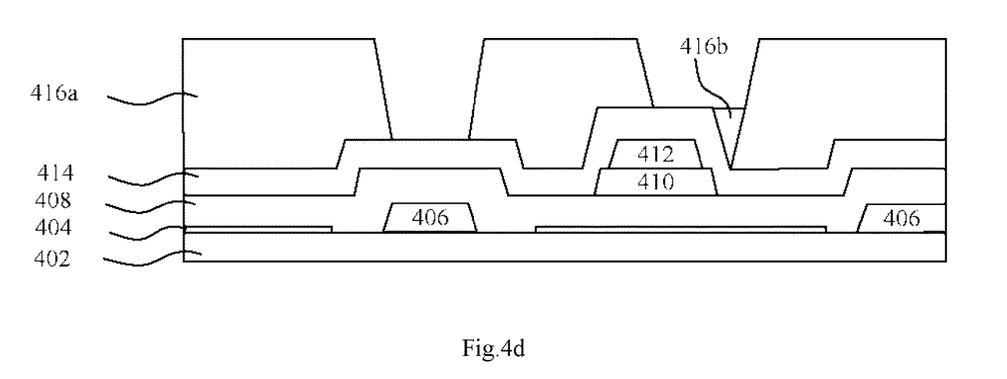

Subsequently, as shown in FIG. 4d, in the first region A, an etching protection layer 416b is formed in a gap C between the photoresist pattern 416a and the passivation layer 414 so that the photoresist pattern 416a is coupled to the passivation layer 414 through the etching protection layer 416b.

Figure 4E:
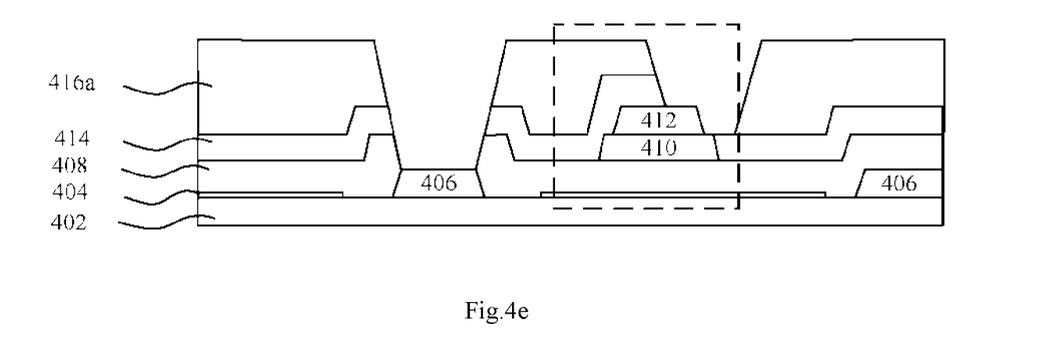

In the following, as shown in FIG. 4e, in the first region A, the etching protection layer 416b is etched away using the photoresist pattern 416a as a mask and at least part of the passivation layer 414 is etched without etching the gate insulating layer 408, thereby exposing a part of the source/drain metal pattern layer 412 and forming a liquid crystal diversion groove (shown by a dashed box). Meanwhile, in the second region B, the gate insulating layer 408 and the passivation layer 414 are etched away using the photoresist pattern 416a a as a mask, thereby exposing the gate metal pattern layer 406.

Figure 4F:
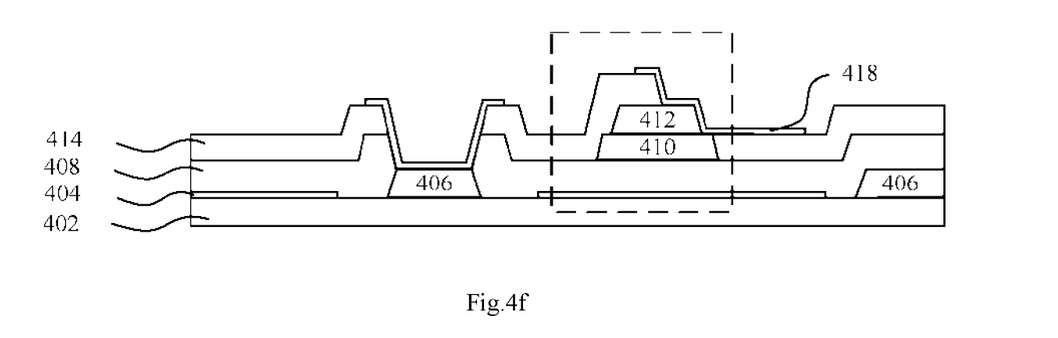

Finally, as shown in FIG. 4f, the photoresist pattern 416a is removed and a pixel electrode pattern layer 418 is formed.

As shown in FIG. 4f, in the array substrate manufactured by the method of manufacturing an array substrate according to the embodiment of the disclosure, due to the liquid crystal diversion groove (shown by a dashed box), the liquid crystal can flow and thus be uniformly distributed on the array substrate. Moreover, no over-etching chamfer is formed below the source/drain metal pattern layer, so the pixel electrode pattern layer 418 is continuous and does not break, thus ensuring and enhancing the display effect and the yield of the liquid crystal display device.

The top surface of the etching protection layer 416b may be exactly flush with the top surface of the passivation layer 414, as shown in FIG. 4d. Alternatively, the top surface of the etching protection layer 416b may be lower or higher than the top surface of the passivation layer 414, as long as it is ensured that, when etching is being performed using the photoresist pattern 416a as a mask, in the first region A, only the etching protection layer 416b and at least part of the passivation layer 414 are etched away, while the gate insulating layer 408 is not etched.

The etching protection layer 416b may be made from any material that can be etched in the process of etching the passivation layer 414. In particular, the etching protection layer 416b may have the same material as the photoresist pattern 416a. For example, the gap C between the photoresist pattern 416a and the passivation layer 414 may be filled with a photoresist after the photoresist pattern 416a is formed, thereby forming the etching protection layer 416b.

FIGS. 5a-5e schematically show sectional views corresponding to steps of a method of manufacturing an array substrate according to another embodiment of the disclosure. In FIGS. 5a-5e, the method of manufacturing an array substrate according to this embodiment of the present disclosure is described still based on an example in which the first metal pattern layer is a gate metal pattern layer, the first insulating layer is a gate insulating layer, the second metal pattern layer is a source/drain metal pattern layer, and the second insulating layer is a passivation layer.

Figure 5A:
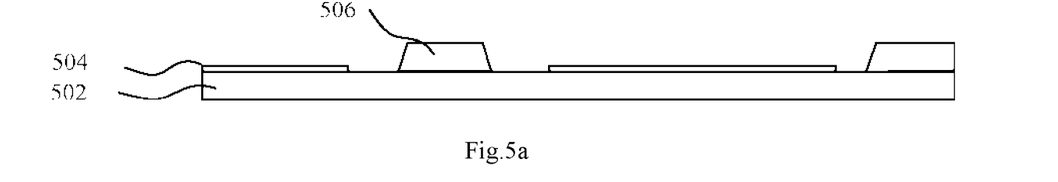
FIGS. 5a-5e schematically shows sectional views corresponding to steps of a method of manufacturing an array substrate according to another embodiment of the present disclosure.

Firstly, as shown in FIG. 5a, a common electrode line pattern 504 and a gate line pattern 506 are formed on a substrate 502. The common electrode line pattern 504 and the gate line pattern 506 may be formed in the same layer with the same material. In this case, the common electrode line pattern 504 and the gate line pattern 506 may be collectively referred to as a gate metal pattern layer.

Figure 5B:
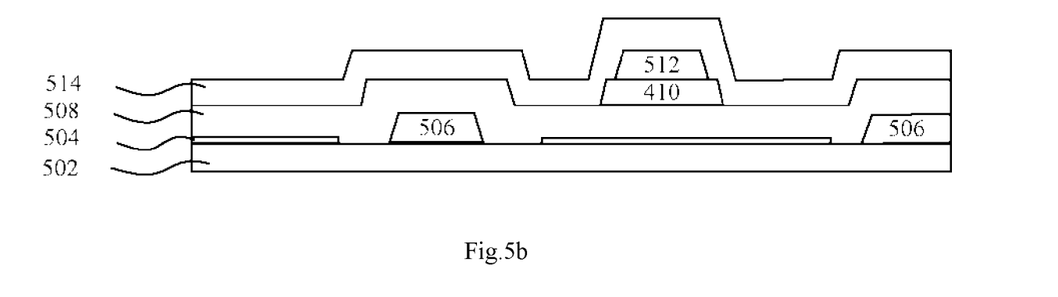

Then, as shown in FIG. 5b, a gate insulating layer 508, an active layer 510, a source/drain metal pattern layer 512, and a passivation layer 514 are formed on the common electrode line pattern 504 and the gate line pattern 506, successively.

Figure 5C:
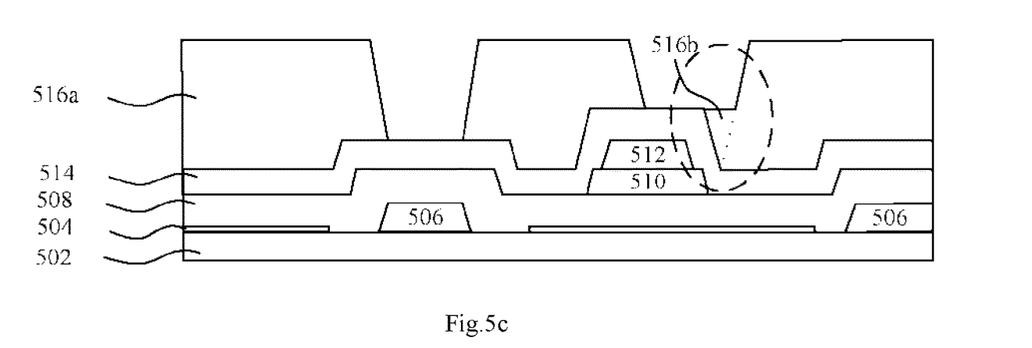

Subsequently, as shown in FIG. 5c, a photoresist is coated on the passivation layer 514, and the photoresist is exposed using a half-tone lithography mask plate, thereby forming a photoresist layer 516. The photoresist layer 516 includes a photoresist pattern 516a and an etching protection layer 516b. In a first region A of the array substrate, the photoresist pattern 516a exposes a part of the top surface of the passivation layer 514 and is coupled to the passivation layer 514 through the etching protection layer 516b, as shown by the ellipse in FIG. 5c. In the first region A, the orthographic projections of the passivation layer 514 and the source/drain metal pattern layer 512 on the substrate 502 overlap. The photoresist pattern 516a further exposes the passivation layer 514 in a second region B of the array substrate. In the second region B, the orthographic projections of the passivation layer 514 and the gate metal pattern layer 506 on the substrate 502 overlap.

In the step shown in FIG. 5c, by using a half-tone lithography mask plate, the photoresist is partially exposed in the first region A and fully exposed in the second region B, so the etching protection layer 516a and the photoresist pattern 516b can be simultaneously formed in one patterning process, thereby simplifying the manufacturing process and saving the manufacturing cost.

Figure 5D:
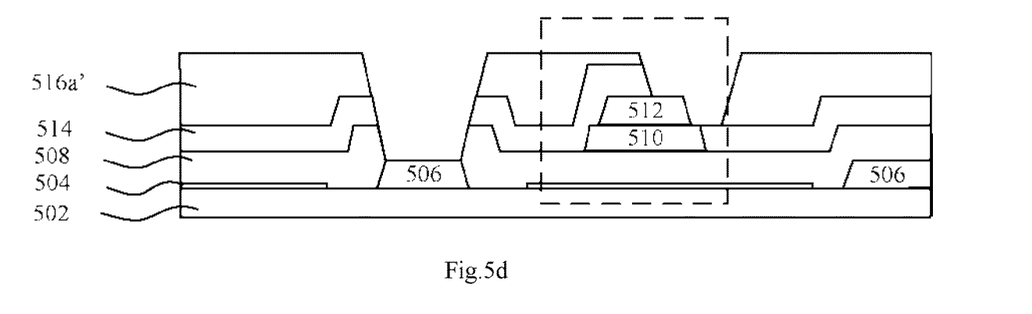

Subsequently, as shown in FIG. 5d, in the first region A, the etching protection layer 516b is etched away using the photoresist pattern 516a as a mask and at least part of the passivation layer 514 is etched without etching the gate insulating layer 508, thereby exposing a part of the source/drain metal pattern layer 512 and forming a liquid crystal diversion groove (shown by a dashed box). During this process, since the etching protection layer 516b and the photoresist pattern 516a are formed at the same time with the same material, the photoresist pattern 516a will also be thinned while the etching protection layer 516b is etched away. Meanwhile, in the second region B, the gate insulating layer 508 and the passivation layer 514 are etched away using the photoresist pattern 516a as a mask, thereby exposing the gate metal pattern layer 506.

Figure 5E:
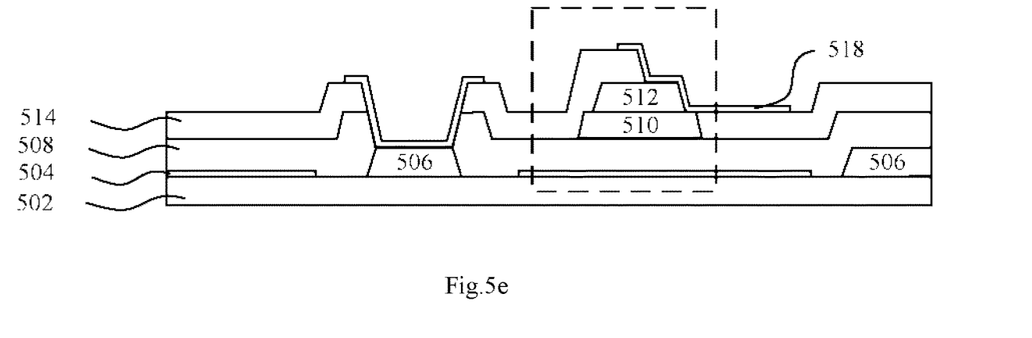

Finally, as shown in FIG. 5e, the thinned photoresist pattern 516a' is removed and a pixel electrode pattern layer 518 is formed.

As used herein, the "half-tone photolithography mask plate" refers to a photolithography mask plate having different light transmission amounts at different positions, so that a photoresist irradiated through this photolithography mask plate have different amounts of exposure at different positions, some portions of the photoresist are fully exposed, some portions are partially exposed, and other portions may be unexposed, resulting in a photoresist pattern with a non-uniform thickness after development. In the case of a positive photoresist, the fully exposed photoresist is completely removed after development, the partially exposed photoresist is partially removed (i.e. thinned) after development, and the unexposed photoresist does not change after development. In such an embodiment, by using a half tone photolithography mask plate, the photoresist pattern and the etching protection layer can be simultaneously formed by one patterning process, thereby simplifying the manufacturing process and saving the manufacturing cost.

In the above embodiments, the first region A and the second region B may be located in the pixel area of the array substrate.

It is to be noted that, although in FIGS. 4a-4f and FIGS. 5a-5e, the inventive concept of the disclosure is discussed taking the liquid crystal diversion groove formed above the source/drain metal pattern layer as an example, as will be appreciated by those skilled in the art, the liquid crystal diversion groove may also be formed in other depressions of the array substrate so that the liquid crystal is uniformly distributed on the array substrate. For example, in FIGS. 4a-4f, the liquid crystal diversion grooves may also be formed above the gate metal pattern layer 406.

An embodiment of the present disclosure further provides an array substrate that is manufactured by the manufacturing method described above.

Another embodiment of the present disclosure further provides a method of manufacturing a liquid crystal display device, comprising: forming an array substrate according to any of the embodiments of the method described above; forming a liquid crystal layer on the array substrate; and forming a color film substrate on the liquid crystal layer for assembly with the array substrate. In some embodiments, providing a liquid crystal layer on the array substrate comprises diverting the liquid crystal through the liquid crystal diversion groove, so that the liquid crystal is continuously distributed in the pixel area of the array substrate.

With such a manufacturing method, the first insulating layer is protected by forming the etching protection layer, so that when etching is being performed using the photoresist pattern as a mask, only the etching protection layer and part of the second insulating layer are etched away, while the first insulating layer is not etched. Thus, the formation of an over-etching chamfer below the second metal pattern layer can be avoided, which enhances the display effect and the yield of the liquid crystal display device.

According to another aspect of the disclosure, there is provided a liquid crystal display device manufactured by means of the method of manufacturing a liquid crystal display device described above.

The inventive concept disclosed herein can be widely applied to various TFT liquid crystal display devices and systems having TFT liquid crystal display devices, such as mobile phones, notebook computers, liquid crystal televisions, and the like.

Unless otherwise defined, the technical terms or scientific terms used herein have the same meanings as commonly understood by those ordinarily skilled in the art to which the present disclosure pertains. The use of "first", "second", and the like in the disclosure does not denote any order, quantity, or importance, but rather merely serves to distinguish between different components. Similarly, "a", "an" or "the" does not mean a limitation of quantity but means that at least one exists. The use of "including" or "comprising" and the like means that an element or item preceding the word encompasses elements or items listed after the word and their equivalents, without excluding other elements or items. The words "connect" or "link" and the like are not limited to physical or mechanical connections, but may include electrical connections, regardless of being direct or indirect. "Upper" "lower," "left," "right," and the like are used only to indicate relative positional relationships. When an absolute position of an object changes, the relative positional relationship may also change accordingly. It should be noted that the features in the above embodiments can be used in any combination without causing conflict.

What have been stated above are some embodiments of the disclosure, but the protection scope of the disclosure is not so limited. Any variations or substitutions that can be easily conceived by those ordinarily skilled in the art within the technical scope revealed by the present disclosure should be encompassed in the protection scope of the disclosure. Thus, the protection scope of the disclosure should be based on the protection scope of the claims.

The invention claimed is:

1. A method of manufacturing an array substrate, comprising:
    forming, on a substrate, a first metal pattern layer, a first insulating layer, a second metal pattern layer, and a second insulating layer, successively;
    coating a photoresist on the second insulating layer;
    forming a photoresist pattern and an etching protection layer, wherein in a first region of the array substrate, an opening of the photoresist pattern exposes a part of a top surface of the second insulating layer, and the etching protection layer is located within the opening and connects the photoresist pattern to the second insulating layer, and wherein in the first region, orthographic projections of the second insulating layer and the second metal pattern layer on the substrate overlap; and
    performing etching in the first region by using the photoresist pattern as a mask to remove the etching protection layer and at least part of the second insulating layer, without etching the first insulating layer, so as to expose a part of the second metal pattern layer and form a liquid crystal diversion groove.

2. The method according to claim 1, wherein the photoresist pattern further exposes the second insulating layer in a second region of the array substrate, and wherein in the second region, orthographic projections of the second insulating layer and the first metal pattern layer on the substrate overlap, wherein the method further comprises:
    in the second region, etching the first insulating layer and the second insulating layer using the photoresist pattern as a mask, so as to expose the first metal pattern layer.

3. The method according to claim 2, wherein the etching protection layer has a same material as the photoresist pattern.

4. The method according to claim 3, wherein the step of forming a photoresist pattern and an etching protection layer comprises:
    exposing the photoresist using a half-tone photolithography mask plate, so that the photoresist is partially exposed in the first region;
    developing the photoresist after exposure so that the etching protection layer and the photoresist pattern are simultaneously formed.

5. The method according to claim 4, wherein exposing the photoresist using the half-tone photolithography mask plate further causes the photoresist to be fully exposed in the second region.

6. The method according to claim 3, wherein the step of forming a photoresist pattern and an etching protection layer comprises:
    in the first region, filling a gap between the photoresist pattern and the second insulating layer with the photoresist.

7. The method according to claim 2, wherein the first region and the second region are located in a pixel area of the array substrate.

8. The method according to claim 1, further comprising forming an active layer pattern on the first insulating layer prior to forming the second metal pattern layer.

9. The method according to claim 1, wherein the first metal pattern layer is a gate metal pattern layer, the first insulating layer is a gate insulating layer, the second metal pattern layer is a source/drain metal pattern layer, and the second insulating layer is a passivation layer.

10. The method according to claim 9, wherein the gate metal pattern layer includes a common electrode line pattern.

11. The method according to claim 10, further comprising removing the photoresist pattern after the liquid crystal diversion groove is formed, and forming a pixel electrode pattern layer.

12. The method according to claim 1, wherein the first metal pattern layer is a source/drain metal pattern layer, the first insulating layer is a gate insulating layer, the second metal pattern layer is a gate metal pattern layer, and the second insulating layer is a passivation layer.

13. The method according to claim 12, wherein the gate metal pattern layer includes a common electrode line pattern.

14. A method of manufacturing a liquid crystal display device, comprising:
    manufacturing an array substrate by the method according to claim 1;
    providing a liquid crystal layer on the array substrate; and
    forming a color filter substrate on the liquid crystal layer for assembly with the array substrate.

15. The method according to claim 14, wherein the photoresist pattern further exposes the second insulating layer in a second region of the array substrate, and wherein in the second region, orthographic projections of the second insulating layer and the first metal pattern layer on the substrate overlap,
    wherein the method further comprises: in the second region, etching the first insulating layer and the second insulating layer using the photoresist pattern as a mask, thereby exposing the first metal pattern layer.

16. The method according to claim 15, wherein the etching protection layer has a same material as the photoresist pattern.

17. The method according to claim 16, wherein the step of forming a photoresist pattern and an etching protection layer comprises:
   exposing the photoresist with a half-tone photolithography mask plate, so that the photoresist is partially exposed in the first region;
   developing the photoresist after exposure so that the etching protection layer and the photoresist pattern are formed simultaneously.

18. The method according to claim 17, wherein exposing the photoresist with the half-tone photolithography mask plate further causes the photoresist to be fully exposed in the second region.

19. The method according to claim 16, wherein the step of forming a photoresist pattern and an etching protection layer comprises: in the first region, filling a gap between the photoresist pattern and the second insulating layer using the photoresist.

20. The method according to claim 14, wherein providing a liquid crystal layer on the array substrate comprises diverting a liquid crystal with the liquid crystal diversion groove so that the liquid crystal is continuously distributed in a pixel area of the array substrate.

* * * * *